(12) United States Patent
Kameyama et al.

(10) Patent No.: US 7,444,600 B2
(45) Date of Patent: Oct. 28, 2008

(54) SYSTEM AND METHOD FOR CIRCUIT NOISE ANALYSIS

(75) Inventors: Atsushi Kameyama, Austin, TX (US); Sunil Konanki, Austin, TX (US); Michael Henry Sitko, Jericho, VT (US)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 11/205,421

(22) Filed: Aug. 17, 2005

(65) Prior Publication Data

US 2007/0044048 A1 Feb. 22, 2007

(51) Int. Cl.
*G06F 17/50* (2006.01)
(52) U.S. Cl. .................... 716/1; 716/6; 716/11; 716/12
(58) Field of Classification Search .................... 716/1, 716/6, 11, 12
See application file for complete search history.

(56) References Cited

U.S. PATENT DOCUMENTS 7,103,863 B2 * 9/2006 Riepe et al. .................... 716/7
2007/0044048 A1 * 2/2007 Kameyama et al. ............ 716/4

OTHER PUBLICATIONS

Shepard, K.L. et al., "Harmony: static noise analysis of deep submicron digital integrated circuits", Computer-Aided-Design of Integrated Circuits and Systems, IEEE Transactions on vol. 18, Issue 8, pp. 1132-1150, Aug. 1999.

Shepard, K.L. et al., "Conquering noise in deep-submicron digital IDs", Design & Test of Computers, IEEE vol. 15, Issue 1, pp. 51-62, Jan. 3, 1998.
Chan, S.C. et al., "Static noise analysis for digital integrated circuits in partially depleted silicon-on-insulator technology", Computer-Aided Design of Integrated Circuits and Systems, IEEE Transactions on vol. 21, Issue 8, pp. 916-927, Aug. 2002.
Shepard and Kim, "Static Noise Analysis for Digital Integrated Circuits in Partially-Depicted Silicon-On-Insulator Technology", 37$^{th}$ Design Automation Conference, pp. 239-242, Jun. 2000.
Patton, "The War on Noise—New tools are needed to attack the noise problem in deep-submicron design", Electronics Journal, pp. 14-17, Oct. 1998.
Chou and Shepard, "Cell characterization for noise stability", Proc IEEE Custom Integrated Circuits Conference 2000, pp. 91-94, May 2000.
Shepard and Kim, "Body-voltage estimation in digital PD-SOI circuits and its application to static timing analysis," Proc IEEE/ACM Int'l Conf on Computer-Aided Design 1999, pp. 531-538, Nov. 1999.

* cited by examiner

*Primary Examiner*—Thuan Do
(74) *Attorney, Agent, or Firm*—Sprinkle IP Law Group

(57) ABSTRACT

Systems and methods for the noise analysis of circuits are presented. These systems and methods may allow a circuit or circuit design to be analyzed for possible noise failures in a block of logic caused by sources outside the block. More particularly, these systems and methods may generate an abstract file for one or more blocks of a circuit. These abstract files may include noise tolerances for input pins and bi-directional pins of a block, along with noise tolerances for those output pins of the block which also feed to an input of one or more gates internal to the block. Using these noise abstracts a unit of the circuit may be analyzed, or the circuit itself may be analyzed for possible noise induced failures.

28 Claims, 4 Drawing Sheets

SYSTEM AND METHOD FOR CIRCUIT NOISE ANALYSIS

TECHNICAL FIELD OF THE INVENTION

The present invention relates generally to noise analysis of circuits and methods for noise analysis in circuits, and more particularly, to hierarchical noise analysis techniques.

BACKGROUND OF THE INVENTION

In recent years, the size of integrated circuits has decreased dramatically. As the size of these integrated circuits has shrunk they have commensurately become increasingly sensitive to noise. Integrated circuits have become more sensitive to noise for a whole host of reasons including: increasing interconnect densities within integrated circuits, faster clock rates utilized in conjunction with these integrated circuits and scaling threshold voltages. All of these factors degrade the signal-to-noise ratio in these circuits. Particularly, increasing interconnect densities imply a significant increase in coupling capacitance. Faster clock rates imply faster on-chip slew times. These two effects combine to make capacitive coupling a growing source of on-chip noise.

Additionally, many high-performance circuits try to speed up one edge transition (typically the falling edge), which usually occurs at the expense of the other edge transition, and assign logical evaluates to the faster edge. Circuits of this type usually have noise sensitivities directly related to the threshold voltages of the transistors responsible for the evaluation of these edge transitions. Threshold voltages are, however, scaling lower to maintain drive in the presence of similarly scaling supply voltages. These effects combine to produce more sources of on-chip noise due to switching circuits as well as less immunity to this noise.

Noise has two deleterious effects on digital circuits and designs, including microprocessor designs. Firstly, when noise acts against a normally static signal, it can transiently destroy the logical information carried by a static node in the circuit. If this ultimately results in incorrect machine states stored in one or more latches, functional failures may result. Secondly, when noise acts simultaneously with a switching node, this may be manifest as a change in the timing of the transition of the node, or other nodes.

In the past, to deal with noise issues of this type, designers of integrated circuits buffered the outputs of certain logic, or blocks of logic, within an integrated circuit. As the clock speeds of these integrated circuits have increased, however, these buffers were rendered obsolete, as they introduced an unacceptable amount of delay into these high speed circuits. For example, in a high speed circuit it may be desirable that paths in the circuit be comprised of less than ten stages of a gate, with a fan out of four or less. If buffers are utilized in this type of circuit to reduce noise, achieving this design goal may be difficult.

Noise behavior is an important characteristic of circuits, as it usually determines the fundamental limit of the performance of these circuits. Consequently, when designing an integrated circuit, a noise analysis of the integrated circuit is usually undertaken to assure the designers of the integrated circuit that the circuit does not exhibit undue sensitivity to noise, or that the integrated circuit will not experience failures due to noise related problems.

Noise analysis for analog circuits can be carried out using a direct method or an adjoint method. However, for system-level noise simulation for a complex integrated circuit, the direct method and the adjoint method are usually too inefficient to be practically utilized. Consequently, hierarchical noise analysis becomes an attractive alternative.

Conventional hierarchical noise analysis of VLSI circuits is usually based on a two step method, which may consist of 1) transistor level noise analysis creating a noise abstract of a logic block and 2) unit/chip level noise analysis using the noise abstracts created in step 1. Utilizing this technique, noise failures inside these logic blocks can only be detected at transistor level noise analysis, while noise failures at the unit/chip level can only be found at unit/chip level noise analysis. The main assumption in this analysis is that each block contains input pins, and output pins or bi-directional pins and only input pins or bi-directional pins feed the gates.

Typically in a hierarchical noise analysis methodology, circuit blocks are pre-characterized for noise tolerance and noise propagation. System-level noise is then analyzed using these block level noise models. More particularly, in certain hierarchical noise analysis techniques an integrated circuit, such as a microchip, is divided into a set of units. Usually, these units contain blocks of logic related to a similar activity.

For example, one unit may contain blocks of logic related to memory management, another unit may contain blocks of logic pertaining to floating point operations, and so forth. During hierarchical noise analysis of the microchip (or other integrated circuit) a transistor level noise analysis is performed on the blocks in the microchip to create a noise abstract for each of the blocks analyzed. Noise analysis can then be performed on specific units or the microchip as a whole using these individual unit noise abstracts.

Noise failures inside each of the blocks of logic can be detected while doing transistor level noise analysis in order to generate the abstract files, while noise failures at the unit or chip level can be found at the unit or chip level analysis. A main assumption in this type of analysis is that each block of logic contains input pins, output pins or bi-directional pins, and only input pins or bi-directional pins feed the gates of each block of logic.

In many cases, however, noise originating outside a block may be fed back to the block through an output of the block. This noise feedback through an output may result in a noise failure at a gate inside a block. For example, if a circuit topology is such that an output signal of a block also propagates to other logic inside the same block, a sufficiently large noise generated outside the block could be fed back through this output and could further proceed back through gates or logic in the block, resulting in a noise failure at a gate inside the block.

Thus, a need exists for systems and methods for hierarchical noise analysis that can account for noise failures in a block of circuitry caused by external sources attached to its output pins.

SUMMARY OF THE INVENTION

Systems and methods for the noise analysis of circuits are presented. These systems and methods may allow a circuit or circuit design to be analyzed for possible noise failures in a block of logic caused by sources outside the block. More particularly, these systems and methods may generate an abstract file for one or more blocks of a circuit. These abstract files may include noise tolerances for input pins and bi-directional pins of a block, along with noise tolerances for those output pins of the block which are also coupled or connected to an input of one or more gates internal to the block. Using these noise abstracts a unit of the circuit may be analyzed, or the circuit itself may be analyzed for possible noise induced failures.

In one embodiment, noise abstracts for each of the blocks of logic of a circuit are formed. These noise abstracts may contain a noise tolerance associated with one or more pins of the corresponding logic. Each of the input pins of the block of logic may have a noise tolerance associated with it, each of the bi-directional pins of the block of logic may have a noise tolerance associated with it, and each output pin of the block of logic which is connected directly or indirectly to logic internal to the block of logic may also have a noise tolerance associated with them in the noise abstract. Based on these noise abstracts noise analysis of the circuit can be conducted.

In one particular embodiment, these noise abstracts may be formed by performing a transistor level analysis on the block of logic for which the noise abstract is being formed.

In another embodiment, the noise tolerances may be represented as a single voltage independent of noise pulse width.

In yet another embodiment, the noise tolerances may be represented as a noise rejection curve of noise amplitude versus noise pulse width.

In other embodiment, a set of noise abstracts for units of the circuit may also be formed, each unit comprising one or more of the blocks of logic.

Embodiments of the present invention may provide the technical advantage of a noise analysis of a circuit which can detect failures within a block of logic which may be caused by noise originating outside of the block of logic. This ability may result in a more sound analysis of a circuit or circuit design and the ability to design and implement high performance circuits without use of additional logic intended to compensate for certain types of noise.

These, and other aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Figure 1:
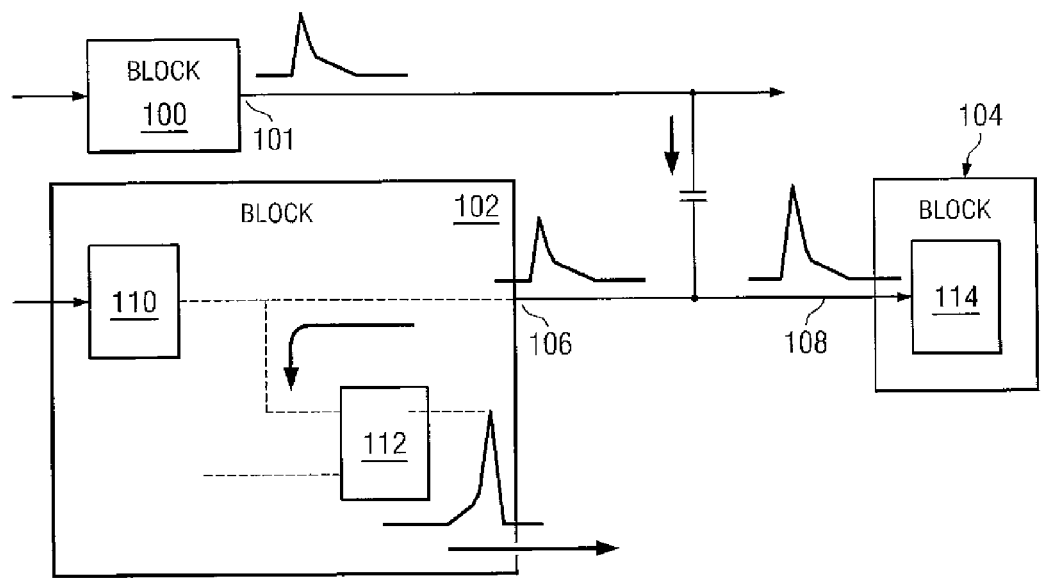
FIG. 1 is a block diagram of an example of a portion of a circuit.

Before describing embodiments of the system and methods of the present invention it may be useful to describe a potential cause of failure in circuits. Turning to FIG. 1, a block diagram of an example of a portion of a circuit that comprises digital circuitry is depicted. The portion of the circuit could represent a digital portion of many integrated circuits, including for example a microprocessor. The circuit of FIG. 1 contains blocks 100, 102, 104 of logic. Each of blocks 100, 102, 104 may in turn comprise gates or logic 110, 112, 114. Blocks 100, 102, 104 may be coupled or connected to one another using interconnects. More particularly, output pin 101 of block 100 may be coupled to output pin 106 of block 102, which is in turn connected to input pin 108 of block 104.

A noise analysis of the portion of circuit in FIG. 1 can use blocks 100, 102, 104 to conduct the noise analysis of the design of the circuit. While it is sometimes assumed during this noise analysis that only noise on the input pins or bi-directional pins of blocks 100, 102, 104 can cause a failure of gates within the block 100, 102, 104, in certain cases, however, noise originating outside a block 100, 102, 104 may be fed back to a gate or logic internal to block 100, 102, or 104. For example, this can potentially happen through an output pin of a block 100, 102, or 104 coupling to pin 106 of block 102.

For example, an input of a gate for logic 112 may be connected to output pin 106 of block 100. Noise generated by the output of pin 101 of block 100, capacitively coupled to output pin 106 of block 102 can potentially be fed back through output pin 106 to the input of gate 112 of block 102. If this noise exceeds a certain threshold, gate 112 may malfunction. However, noise analysis techniques that do not account for this feed back noise may not detect such a malfunction.

Attention is now directed to systems and methods for the noise analysis of circuits. These systems and methods may allow a circuit or circuit design to be analyzed for possible noise failures in a block of logic caused by sources outside the block (in addition to the noise associated with the blocks themselves). More particularly, these systems and methods may generate an abstract file for one or more blocks of a circuit where the abstract files may include noise tolerances for input pins and bi-directional pins of a block, along with noise tolerances for those output pins of the block which also feed or are coupled to an input of one or more gates internal to the block. Using these noise abstracts, a unit of the circuit, multiple units of the circuit or the entire circuit itself may be analyzed for possible noise induced failures (including failures caused by or exacerbated by noise initiating from sources external to the blocks themselves).

Figure 2:
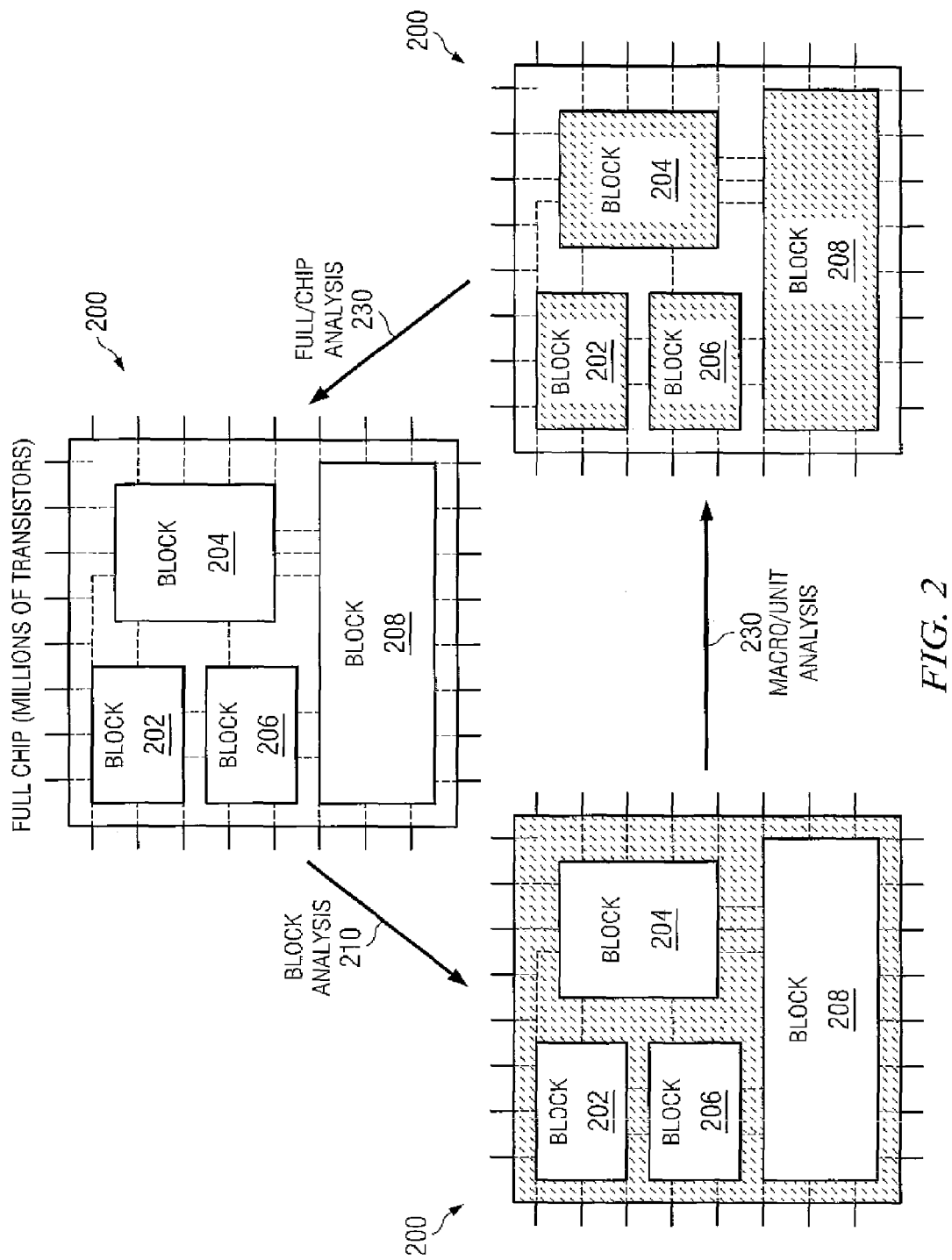
FIG. 2 depicts one embodiment of a method for noise analysis of a circuit.

Turning to FIG. 2, a general overview of one embodiment of a hierarchical noise analysis methodology applied to an integrated circuit or portion of a microchip device (in particular a microchip device or portion of a microchip device) is depicted. Chip 200 may consist of a large number of transistors, in many cases millions or more. According to one embodiment of the invention, hierarchical noise analysis of chip 200 may be performed in a three step method as shown in FIG. 2. More particularly, a block level noise analysis for one or more blocks of logic 202, 204, 206, 208 may be preformed at step 210 followed by a unit level noise analysis and/or chip level noise analysis using the results of the block level noise analysis at steps 220 and step 230 respectively. It will be noted that the improved hierarchical noise analysis techniques described herein, such as the hierarchical noise analysis of chip 200, block level noise analysis (step 210), unit level noise analysis (step 220) or chip level noise analysis (step 230) may be implemented in conjunction with existing techniques and tools for performing hierarchical noise analysis, such as IBM's macro level signal analysis tool, also known as IBMmlsa, or Cadence's PacifIC Static Noise Analyzer, among others.

Returning to FIG. 2, at step 210 a block level noise analysis is performed by analyzing the static noise that occurs within one or more blocks 202, 204, 206, and 208 of transistors or gates. In certain embodiments, a transistor level analysis of transistors, capacitors or wires within each block 202, 204, 206, 208 is undertaken to. determine the overall behavior of the block 202, 204, 206, 208. A noise failure inside a block 202, 204, 206, 208 may be determined during this analysis. Additionally, during this block level analysis (at step 210) a noise abstract may be generated for blocks 202, 204, 206 and 208.

A noise abstract may be a black box model for blocks 202, 204, 206, 208 containing a noise tolerance level or capacitance for each input pin of the block 202, 204, 206, 208, a perpetrator capacitance, a drive resistance for each output pin of the block 202, 204, 206, 208, and noise tolerance levels, and capacitance and drive resistance for bi-directional pins of a block 202, 204, 206, 208.

The noise tolerance of a pin may express the amount of noise that can be input to, or received at, the pin of the block 202, 204, 206, 208 without causing a failure of the block 202, 204, 206, 208 or any gates or transistor of the block 202, 204, 206, 208. This noise tolerance may be modeled as a single voltage value (which may also be referred to as a DC noise tolerance) that is independent of any pulse width. The noise tolerance may also be modeled as a noise rejection curve expressing acceptable noise amplitude versus pulse width.

Figure 3:
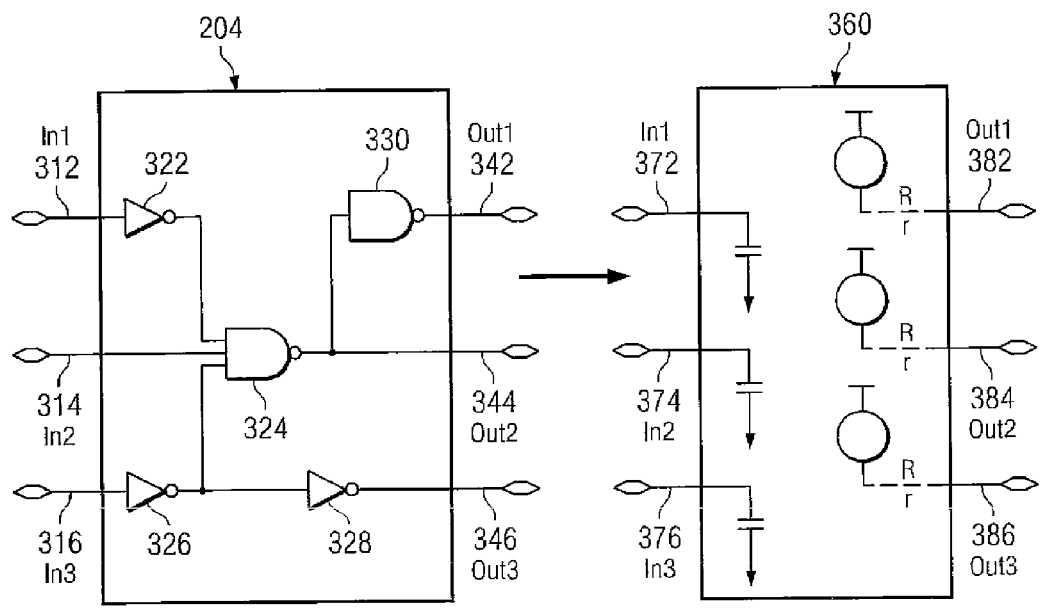
FIG. 3 is a representation of an example block of logic and one embodiment of a noise abstract representing the example block of logic.

Turning to FIG. 3, a representation of one embodiment of the noise analysis of step 210 is depicted. More particularly, one embodiment of a noise abstract which may be generated during the noise analysis of step 210 is depicted. Block 204 may be a circuit comprised of gates (group of transistors), wires, capacitors, resistors, etc. in chip 200. In particular, block 204 may have input pins or lines 312, 314 and 316. Input line 312 is fed to gate 322, input line 314 is fed to gate 324 and input line 316 is fed gate 326. The output of gates 322 and 326 are fed to gate 324, while the output of gate 326 is additionally fed to gate 328. The output of gate 324 is fed to output line 344 and gate 330. The output of gate 330 is fed to output pin 342 and the output of gate 328 is fed to output pin 346. It will be understood that block 204 is used for exemplary purposes only and the noise analysis techniques described may equally well be applied to any block whatsoever.

In one embodiment, block 204 may be analyzed by transistor level analysis to generate noise abstract 360. This noise abstract 360 may represent block 204 as a black box, with a set of representative input pins 372, 374, 376 which represent input pins 312, 314, 316 of block 204. Each of these representative input pins 372, 374, 376 may have a noise level or a capacitance associated with it. Noise abstract 360 also has a set of representative output pins 382, 384, 386 representing output pins 342, 344 and 346 of block 204. Each of these representative output pins 342, 344 and 346 may have a drive resistance or voltage source associated with it.

In one embodiment, when noise abstract 360 is created for block 204 the desired output noise level at output pins 342, 344 or 346 is given as a parameter to the analysis process for block 204. The noise tolerance at each representative input pin 372, 374 and 376 can then be determined such that if the input noise at input pins 312, 314 and 316 is below the noise tolerance associated with each of representative input pins 372, 374 and 376 then the output noise at output pins 342, 344, 346 will be equal to or less than the desired output noise level at output pins 342, 344 and 346. In one embodiment, this noise abstract may be contained in a file suitable for use by a program operable to perform unit or chip level analysis.

Returning briefly to FIG. 2, after this block level noise analysis is performed at step 210 a unit level noise analysis may be performed at step 220 or a chip level noise analysis may be performed at step 230. A unit may be a group of one or more logical blocks 202, 204, 206, 208. In particular, a unit level noise analysis may be an analysis of a group of blocks of logic 202, 204, 206, 208 with related functionality. For example, a unit level analysis may analyze one or more blocks 202, 204, 206, 208 of logic suitable for implementing a floating point unit of chip 200.

In one embodiment, a unit level analysis may be performed by an analysis tool which analyzes the global interconnects between the blocks 202, 204, 206, 208 of logic on which the unit level analysis is being performed. This analysis tool may determine the noise at each net sink or pin of a block 202, 204, 206, 208 in the unit for which a noise tolerance has been associated, and report each of these net sinks where the noise exceeds the noise tolerance.

This unit level analysis may be performed on a unit using the abstract files generated for each of the blocks of the unit in step 210. As mentioned above, these abstract files may have a set of representative input pins associated with a noise tolerance or a pin capacitance, and a set of representative output pins associated with an output resistance, an output capacitance or a generated output noise. Thus, a noise analysis for a unit of chip 200 may be performed using resistor/capacitor (RC) simulation with a representation of the blocks in a unit composed of equivalent resistors, capacitors or voltage sources.

Figure 4:
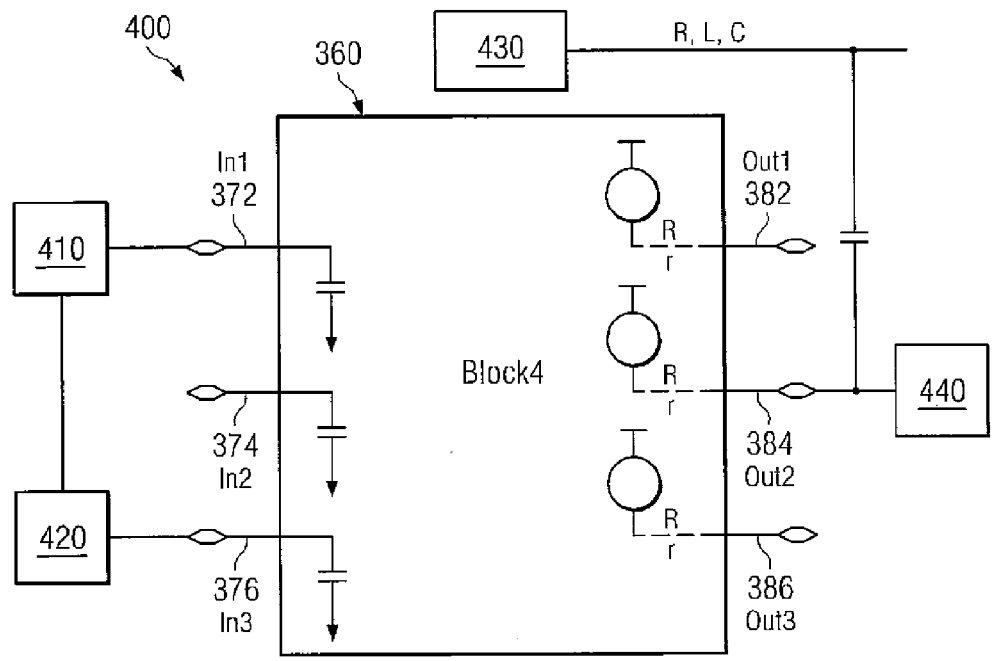
FIG. 4 is a representation of one embodiment of using the noise abstract of FIG. 3 to analyze an example unit containing the example block of logic of FIG. 3.

A representation of one embodiment of the analysis of a unit is depicted in FIG. 4. More specifically, FIG. 4 depicts the analysis of unit 400 using noise abstract 360 of block 204 (depicted in FIG. 3) of unit 400 and noise abstracts 410, 420, 430 and 440 each of which is a noise abstract for a block of logic within unit 400. As discussed above, abstract file 360 contains a set of representative input pins 372, 374, 376 which represent input pins 312, 314, 316 of block 300. Each of these representative input pins 372, 374, 376 may have a noise level and a capacitance associated with it. Noise abstract file 360 also has a set of representative output pins 382, 384, 386 representing output pins 342, 344 and 346 of block 300.

Using abstract files 410, 420, 430, 440 and 360, an RC simulation may be performed to see if the noise at pins 312, 314, 316 of block 204 will exceed the noise threshold associated with representative input pins 372, 374 or 376. Similarly, using abstract files 410, 420, 430, 440, and 360, an RC simulation may be performed to see if the noise at any one of the pins of the other blocks of unit exceeds the noise tolerance associated with the corresponding representative pin in the abstract of the block. This unit level analysis may result in a noise abstract file being generated for the unit.

Returning once again to FIG. 2, after this unit level analysis is performed at step 220 a chip level analysis may be performed for chip 200 at step 230. This chip level analysis may be performed using techniques similar to those utilized with respect to the unit level analysis at step 220. In other words, the chip level analysis may utilize abstract files for the blocks or units within chip 200 to determine if a noise level exceeds a noise tolerance level for any of blocks 202, 204, 260, 208 or a unit within chip 200. This chip level analysis at step 230 may also be performed directly after the block level analysis 210, or may be performed using virtually any combination of noise abstract files generated at step 210 or step 220.

Notice, however, that output line 344 of block 204 feeds gate 330 (as shown in FIG. 3). Thus, a sufficiently large noise generated outside block 204 and fed back through output line 344 (represented by representative output pin 384) may cause a noise failure at gate 330 inside block 204. For example, referring to FIG. 4, suppose that the block represented by noise abstract 430 is capacitively coupled to output line 344 of block 204 represented by abstract file 360. In this case, if the output of the block represented by abstract 430 is sufficiently noisy this noise could be fed back through output pin 344 and cause the failure of gate 330.

In one embodiment, possible failures of a circuit which may be induced by noise of this type can be caught at step 210 when generating noise abstracts for blocks. More specifically, when generating a noise abstract for a block at step 210, noise tolerances may be generated for output pins of the block which also feed to the input of other gates in the block. When performing a unit level analysis at step 220 or a chip level analysis at step 230 a noise level can be obtained for that output pin and compared with the noise tolerance for that output pin in the abstract file, as described above with respect to input or bi-directional pins, and a possible failure detected.

Figure 5:
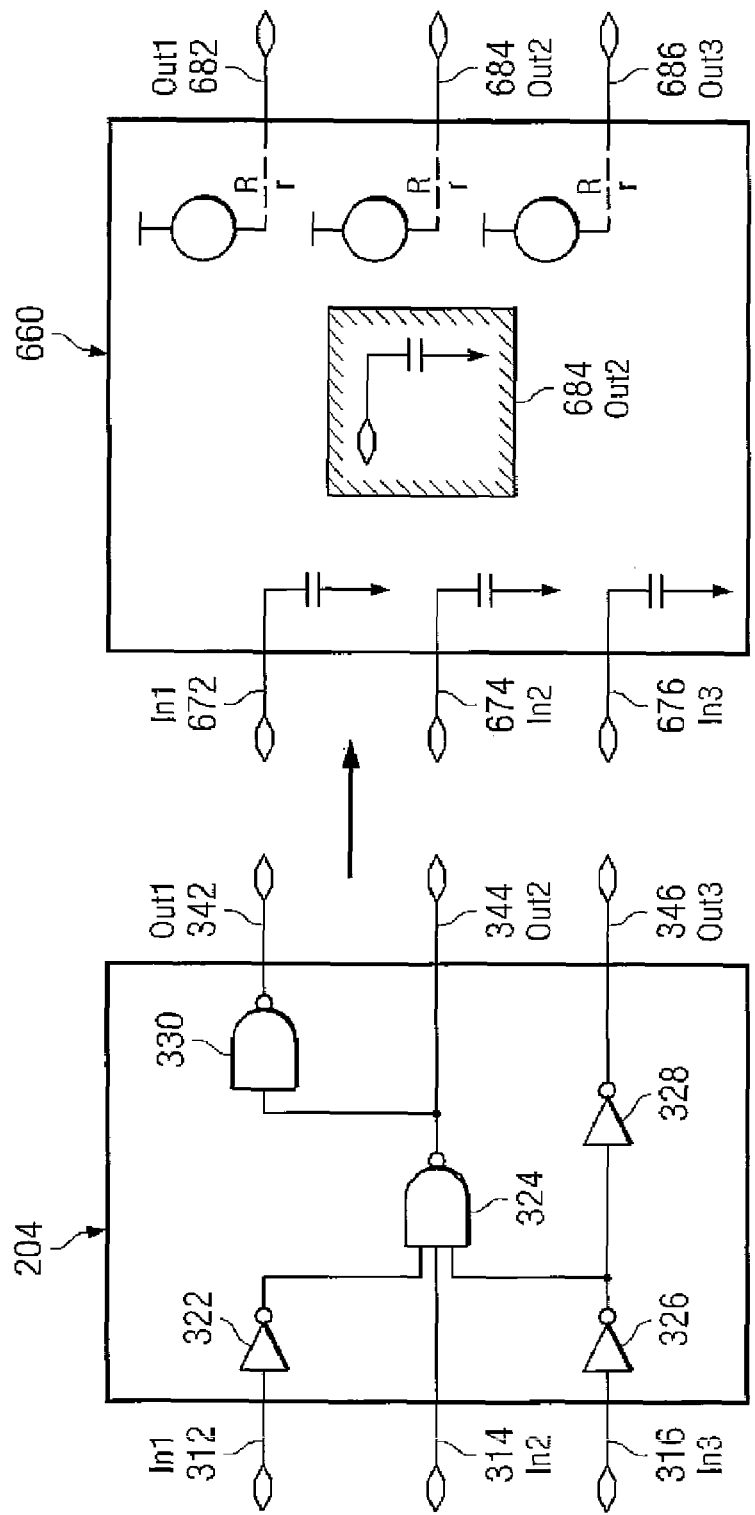
FIG. 5 is a representation of an example block of logic and one embodiment of a noise abstract representing the example block of logic.

Turning to FIG. 5, a representation of the generation of a noise abstract taking into account outputs of the block which feed to internal logic of the block is depicted. Block 204 may be a circuit comprising transistors, gates, wires etc. In particular, block 204 may have input pins or lines 312, 314 and 316. Input line 312 feeds gate 322, input line 314 feeds gate 324 and input line 316 feeds gate 326. The output of gates 322 and 326 feed to gate 324, while the output of gate 326 additionally feeds gate 328. The output of gate 324 is fed to output line 344 and gate 330. Thus, output line 344 feeds gate 330. The output of gate 330 feeds output pin 342 and the output of gate 328 feeds to output pin 346.

Block 204 may be analyzed, in one embodiment by transistor level analysis, to generate noise abstract file 660. This noise abstract 660 may represent block 204 as a black box, with a set of representative input pins 672, 674, 676 which represent input pins 312, 314, 316 of block 204. Each of these representative input pins 672, 674, 676 may have a noise level or a capacitance associated with it. Noise abstract 660 also has a set of representative output pins 682, 684, 686 representing output pins 342, 344 and 346 of block 204. Each of these representative output pins 682, 684 and 686 may have a drive resistance or voltage source associated with it. In addition, during analysis of block 204 it may be determined that output pin 344 is fed to an internal gate of block 204. Thus, representative output pin 684 additionally may have a noise tolerance level or capacitance associated with it. This noise tolerance level may be stored in noise abstract 660. Noise abstract 660 may then be utilized in a unit level or chip level analysis at step 220 or step 230 respectively.

Figure 6:
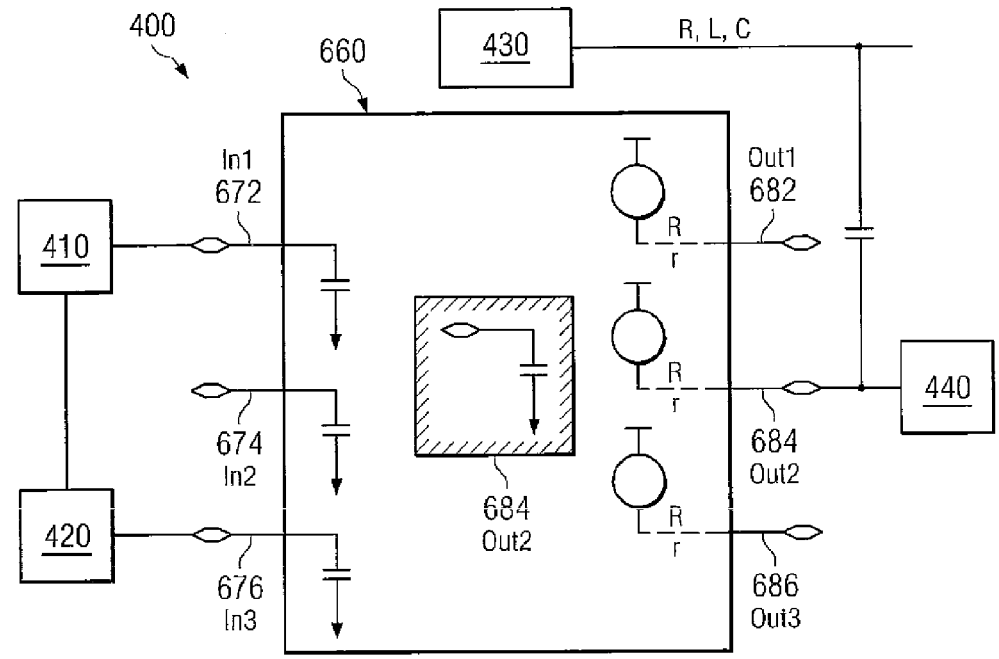
FIG. 6 is a representation of one embodiment of using the noise abstract of FIG. 5 to analyze an example unit containing the example block of logic of FIG. 5.

A representation of one embodiment of the analysis of a unit is depicted in FIG. 6. More specifically, FIG. 6 depicts the analysis of unit 400 using noise abstract 660 of block 204 (depicted in FIG. 5) of unit 400 and noise abstracts 410, 420, 430 and 440 each of which is a noise abstract for a block of logic within unit 400. As discussed above, noise abstract 660 contains a set of representative input pins 672, 674, 676 which represent input pins 312, 314, 316 of block 204. Each of these representative input pins 672, 674, 676 may have a noise tolerance level or a capacitance associated with it. Noise abstract 660 also has a set of representative output pins 682, 684, 686 representing output pins 342, 344 and 346 of block 204. Representative output pin 684 has a noise tolerance level or capacitance associated with it. Using noise abstracts 410, 420, 430, 440, 660 an RC simulation may be performed to see if the noise at pins 312, 314, 316 and 344 of block 204 will exceed the noise threshold associated with representative input pins 672, 674 676 or representative output pin 684. Similarly, using noise abstracts 410, 420, 430, 440, 660 an RC simulation may be performed to see if the noise at any one of the pins of other blocks of unit 400 exceeds the noise tolerance associated with the corresponding representative pin in the corresponding noise abstract. This unit level analysis may result in a noise abstract file being generated for unit 600.

Though in FIG. 6 noise abstract 600 is particularly described as having been formed by one embodiment of a noise analysis technique which accounts for output pins feeding logic internal to the block for which the noise abstract is being formed it will be apparent that any of the other noise abstracts 410, 420, 430, 440 may or may not have been formed by embodiments of the same or similar embodiments of these noise analysis techniques, and unit or chip analysis may be accomplished with any combination of these types of noise abstracts. For example, only noise abstract 660 may have been formed by one embodiment of these type of noise analysis techniques, noise abstract 410 and noise abstract 660 may have been formed by one embodiment of these type of noise analysis techniques or all of noise abstracts 410, 420, 430, 440 and 660 may have been formed by one embodiment of these type of noise analysis techniques.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A method for performing noise analysis of a circuit, comprising:

forming a set of noise abstracts for a set of blocks of logic of a circuit, each of the set of noise abstracts corresponding to a block of logic in the set of blocks of logic, wherein each of the set of noise abstracts for the set of blocks of logic of the circuit is formed by performing a transistor level analysis of the block of logic corresponding to the noise abstract, each block of logic in the set of blocks of logic comprises a set of input pins, a set of output pins and a set of bi-directional pins and each of the set of noise abstracts for the set of blocks of logic comprises a noise tolerance for each of the set of input-pins of the corresponding block of logic, a noise tolerance for each of the set of bi-directional-pins of the corresponding block of logic and a noise tolerance level for each of the set of output pins of the corresponding block of logic which feeds an input of internal logic of the corresponding block of logic and the noise tolerance for each of the set of input-pins of the corresponding block of logic, the noise tolerance for each of the set of bi-directional-pins of the corresponding block of logic and the noise tolerance level for each of the set of output pins of the corresponding block of logic which feeds an input of internal logic of the corresponding block of logic is a single voltage independent of noise pulse width; and performing a noise analysis of the circuit utilizing the set of noise abstracts.

2. The method of claim 1, further comprising forming a set of noise abstracts for a set of units of the circuit, wherein each unit comprises one or more blocks in the set of blocks of logic.

3. The method of claim 2, wherein forming the set of noise abstracts for the set of units of the circuit is done using resistor/capacitor (R/C) analysis.

4. The method of claim 1, wherein performing a noise analysis of the circuit further comprises determining if a calculated noise level at a pin in the set of input pins of a block of logic, the set of output pins of the block of logic which feed an input of internal logic of the block of logic or the set of bi-directional pins exceeds the noise tolerance for the pin in the noise abstract associated with the block.

5. The method of claim 4, wherein performing the noise analysis of the circuit is done using resistor/capacitor (R/C) analysis.

6. The method of claim 4, wherein each of the set of noise abstracts for the set of blocks of logic comprises a capacitance for each of the set of input-pins of the corresponding block of logic, a capacitance and drive resistance for each of the set of bi-directional-pins of the corresponding block of logic and a drive resistance for each of the set of output pins.

7. The method of claim 6, wherein performing a noise analysis of the circuit is done using a set of equivalent circuits, wherein each equivalent circuit represents a corresponding block of the set of blocks of logic with a set of resistors, capacitors or voltage sources.

8. A method for performing noise analysis of a circuit, comprising:

forming a set of noise abstracts for a set of blocks of logic of a circuit, each of the set of noise abstracts corresponding to a block of logic in the set of blocks of logic, wherein each of the set of noise abstracts for the set of blocks of logic of the circuit is formed by performing a transistor level analysis of the block of logic corresponding to the noise abstract, each block of logic in the set of blocks of logic comprises a set of input pins, a set of output pins and a set of bi-directional pins and each of the set of noise abstracts for the set of blocks of logic comprises a noise tolerance for each of the set of input-pins of the corresponding block of logic, a noise tolerance for each of the set of bi-directional-pins of the corresponding block of logic and a noise tolerance level for each of the set of output pins of the corresponding block of logic which feeds an input of internal logic of the corresponding block of logic and the noise tolerance for each of the set of input-pins of the corresponding block of logic, the noise tolerance for each of the set of bi-directional-pins of the corresponding block of logic and the noise tolerance level for each of the set of output pins of the corresponding block of logic feeds an input of internal logic of the corresponding block of logic is a noise rejection curve of noise amplitude versus noise pulse width; and performing a noise analysis of the circuit utilizing the set of noise abstracts.

9. The method of claim 8, further comprising forming a set of noise abstracts for a set of units of the circuit, wherein each unit comprises one or more blocks in the set of blocks of logic.

10. The method of claim 9, wherein forming the set of noise abstracts for the set of units of the circuit is done using resistor/capacitor (R/C) analysis.

11. The method of claim 8, wherein performing a noise analysis of the circuit further comprises determining if a calculated noise level at a pin in the set of input pins of a block of logic, the set of output pins of the block of logic which feed an input of internal logic of the block of logic or the set of bi-directional pins exceeds the noise tolerance for the pin in the noise abstract associated with the block.

12. The method of claim 11, wherein performing the noise analysis of the circuit is done using resistor/capacitor (R/C) analysis.

13. The method of claim 11, wherein each of the set of noise abstracts for the set of blocks of logic comprises a capacitance for each of the set of input-pins of the corresponding block of logic, a capacitance and drive resistance for each of the set of bi-directional-pins of the corresponding block of logic and a drive resistance for each of the set of output pins.

14. The method of claim 11, wherein performing a noise analysis of the circuit is done using a set of equivalent circuits, wherein each equivalent circuit represents a corresponding block of the set of blocks of logic with a set of resistors, capacitors or voltage sources.

15. A computer readable medium, having instructions embodied thereon for performing noise analysis of a circuit, the instructions translatable for:

forming a set of noise abstracts for a set of blocks of logic of a circuit, each of the set of noise abstracts corresponding to a block of logic in the set of blocks of logic, wherein each of the set of noise abstracts for the set of blocks of logic of the circuit is formed by performing a transistor level analysis of the block of logic corresponding to the noise abstract, each block of logic in the set of blocks of logic comprises a set of input pins, a set of output pins and a set of bi-directional pins and each of the set of noise abstracts for the set of blocks of logic comprises a noise tolerance for each of the set of input-pins of the corresponding block of logic, a noise tolerance for each of the set of bi-directional-pins of the corresponding block of logic and a noise tolerance level for each of the set of output pins of the corresponding block of logic which feeds an input of internal logic of the corresponding block of logic and the noise tolerance for each of the set of input-pins of the corresponding block of logic, the noise tolerance for each of the set of bi-directional-pins of the corresponding block of logic and the noise tolerance level for each of the set of output pins of the corresponding block of logic which feeds an input of internal logic of the corresponding block of logic is a single voltage independent of noise pulse width; and performing a noise analysis of the circuit utilizing the set of noise abstracts.

16. The computer readable medium of claim 15, wherein the instructions are further translatable for forming a set of noise abstracts for a set of units of the circuit, wherein each unit comprises one or more blocks in the set of blocks of logic.

17. The computer readable medium of claim 15, wherein forming the set of noise abstracts for the set of units of the circuit is done using resistor/capacitor (R/C) analysis.

18. The computer readable medium of claim 15, wherein performing a noise analysis of the circuit further comprises determining if a calculated noise level at a pin in the set of input pins of a block of logic, the set of output pins of the block of logic which feed an input of internal logic of the block of logic or the set of bi-directional pins exceeds the noise tolerance for the pin in the noise abstract associated with the block.

19. The computer readable medium of claim 18, wherein performing the noise analysis of the circuit is done using resistor/capacitor (R/C) analysis.

20. The computer readable medium of claim 18, wherein each of the set of noise abstracts for the set of blocks of logic comprises a capacitance for each of the set of input-pins of the corresponding block of logic, a capacitance and drive resistance for each of the set of bi-directional-pins of the corresponding block of logic and a drive resistance for each of the set of output pins.

21. The computer readable medium of claim 20, wherein performing a noise analysis of the circuit is done using a set of equivalent circuits, wherein each equivalent circuit represents a corresponding block of the set of blocks of logic with a set of resistors, capacitors or voltage sources.

22. A computer readable medium, having instructions embodied thereon for performing noise analysis of a circuit, the instructions translatable for:

forming a set of noise abstracts for a set of blocks of logic of a circuit, each of the set of noise abstracts corresponding to a block of logic in the set of blocks of logic, wherein each of the set of noise abstracts for the set of blocks of logic of the circuit is formed by performing a transistor level analysis of the block of logic corresponding to the noise abstract, each block of logic in the set of blocks of logic comprises a set of input pins, a set of output pins and a set of bi-directional pins and each of the set of noise abstracts for the set of blocks of logic comprises a noise tolerance for each of the set of input-pins of the corresponding block of logic, a noise tolerance for each of the set of bi-directional-pins of the corresponding block of logic and a noise tolerance level for each of the set of output pins of the corresponding block of logic which feeds an in input of internal logic of the corresponding block of logic and the noise tolerance for each of the set of input-pins of the corresponding block of logic, the noise tolerance for each of the set of bi-directional-pins of the corresponding block of logic and the noise tolerance level for each of the set of output pins of the corresponding block of logic feeds an input of internal logic of the corresponding block of logic is a noise rejection curve of noise amplitude versus noise pulse width; and performing a noise analysis of the circuit utilizing the set of noise abstracts.

23. The computer readable medium of claim 22, wherein the instructions are further translatable for forming a set of noise abstracts for a set of units of the circuit, wherein each unit comprises one or more blocks in the set of blocks of logic.

24. The computer readable medium of claim 23, wherein forming the set of noise abstracts for the set of units of the circuit is done using resistor/capacitor (R/C) analysis.

25. The computer readable medium of claim 22, wherein performing a noise analysis of the circuit further comprises determining if a calculated noise level at a pin in the set of input pins of a block of logic, the set of output pins of the block of logic which feed an input of internal logic of the block of logic or the set of bi-directional pins exceeds the noise tolerance for the pin in the noise abstract associated with the block.

26. The computer readable medium of claim 25, wherein performing the noise analysis of the circuit is done using resistor/capacitor (R/C) analysis.

27. The computer readable medium of claim 25, wherein each of the set of noise abstracts for the set of blocks of logic comprises a capacitance for each of the set of input-pins of the corresponding block of logic, a capacitance and drive resistance for each of the set of bi-directional-pins of the corresponding block of logic and a drive resistance for each of the set of output pins.

28. The computer readable medium of claim 27, wherein performing a noise analysis of the circuit is done using a set of equivalent circuits, wherein each equivalent circuit represents a corresponding block of the set of blocks of logic with a set of resistors, capacitors or voltage sources.

* * * * *

UNITED STATES PATENT AND TRADEMARK OFFICE
CERTIFICATE OF CORRECTION

| | | |
|---|---|---|
| PATENT NO. | : 7,444,600 B2 | Page 1 of 1 |
| APPLICATION NO. | : 11/205421 | |
| DATED | : October 28, 2008 | |
| INVENTOR(S) | : Atsushi Kameyama, Sunil Konanki and Michael Henry Sitko | |

It is certified that error appears in the above-identified patent and that said Letters Patent is hereby corrected as shown below:

Title Page add (73)

Insert --International Business Machines Corporation, Armonk, New York--

Signed and Sealed this

Ninth Day of February, 2010

David J. Kappos
*Director of the United States Patent and Trademark Office*